(12) United States Patent
Platzgummer et al.

(10) Patent No.: US 8,198,601 B2
(45) Date of Patent: Jun. 12, 2012

(54) METHOD FOR PRODUCING A MULTI-BEAM DEFLECTOR ARRAY DEVICE HAVING ELECTRODES

(75) Inventors: Elmar Platzgummer, Vienna (AT); Heinrich Fragner, Vienna (AT)

(73) Assignee: IMS Nanofabrication AG, Vienna (AT)

( * ) Notice: Subject to any disclaimer, the term of this patent is extended or adjusted under 35 U.S.C. 154(b) by 350 days.

(21) Appl. No.: 12/692,679

(22) Filed: Jan. 25, 2010

(65) Prior Publication Data
US 2010/0187434 A1    Jul. 29, 2010

(30) Foreign Application Priority Data
Jan. 28, 2009 (EP) ..................... 09450018

(51) Int. Cl.
*H01J 37/147* (2006.01)
(52) U.S. Cl. ........... 250/396 R; 250/492.2; 250/492.22; 250/492.23
(58) Field of Classification Search ........... None
See application file for complete search history.

(56) References Cited

U.S. PATENT DOCUMENTS

| | | | | |
|---|---|---|---|---|
| 5,369,282 A * | 11/1994 | Arai et al. | ........... | 250/492.22 |
| 6,326,632 B1 * | 12/2001 | Buschbeck et al. | ....... | 250/492.21 |
| 6,768,125 B2 * | 7/2004 | Platzgummer et al. | .. | 250/492.22 |
| 6,818,911 B2 * | 11/2004 | Tamamori et al. | ....... | 250/492.22 |
| 7,687,783 B2 * | 3/2010 | Platzgummer et al. | ... | 250/396 R |
| 2008/0203317 A1 * | 8/2008 | Platzgummer et al. | ... | 250/396 R |
| 2010/0288938 A1 * | 11/2010 | Platzgummer | ........... | 250/396 R |

FOREIGN PATENT DOCUMENTS

| | | |
|---|---|---|
| EP | 1 406 290 A2 | 4/2004 |
| EP | 1 993 118 A2 | 11/2008 |
| JP | 2003303760 | 10/2003 |

OTHER PUBLICATIONS

Berry et al., "Programmable Aperture Plate for Maskless High-Throughput Nanolithography" Journal of Vacuum Science and Technology, Part B, 15(6), Nov./Dec. 1997, pp. 2382-2386.
Extended European Search Report for EPO Application No. 10450006.1-2208 dated May 7, 2010.
Communication for European Patent Application No. 10450006.1 dated Jan. 27, 2011.

* cited by examiner

*Primary Examiner* — Jack Berman
(74) *Attorney, Agent, or Firm* — Sutherland Asbill & Brennan LLP

(57) ABSTRACT

The disclosure relates to a method for producing a multi-beam deflector array device with a plurality of openings for use in a particle-beam exposure apparatus, in particular a projection lithography system, said method starting from a CMOS wafer and comprising the steps of generating at least one pair of parallel trenches on the first side of the wafer blank at the edges of an area where the circuitry layer below is non-functional, the trenches reaching into the layer of bulk material; passivating the sidewalls and bottom of the trenches; depositing a conducting filling material into the trenches, thus creating columns of filling material serving as electrodes; attaching metallic contact means to the top of the electrodes; structuring of an opening between the electrodes, said opening stretching across abovementioned area so that the columns are arranged opposite of each other on the sidewalls of the opening.

20 Claims, 8 Drawing Sheets

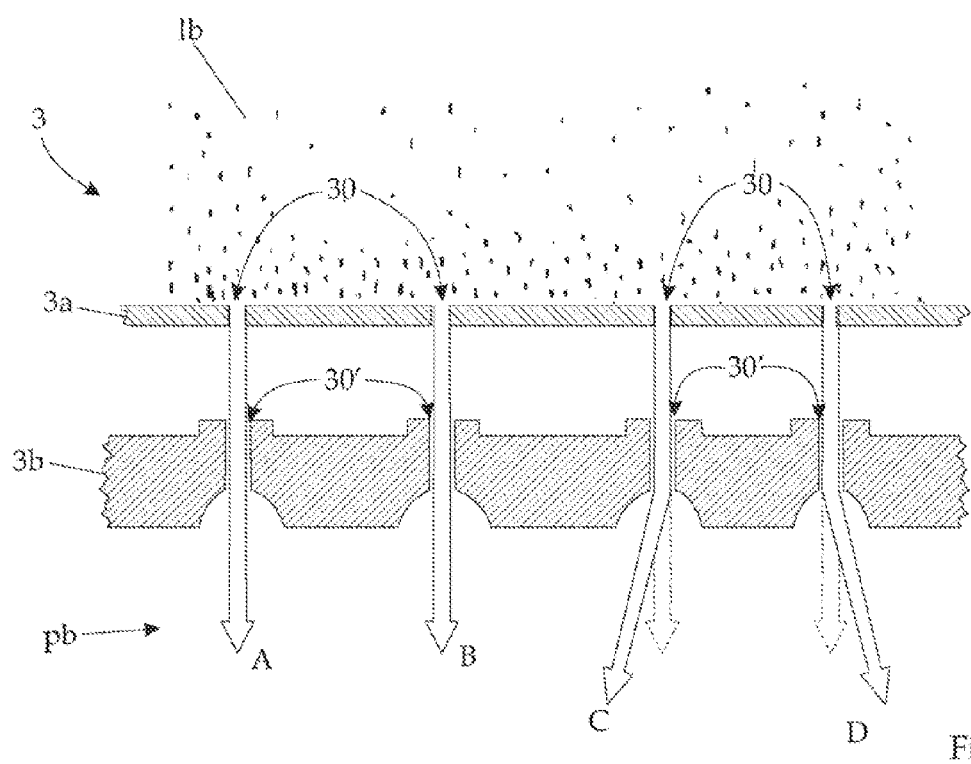
Fig. 2
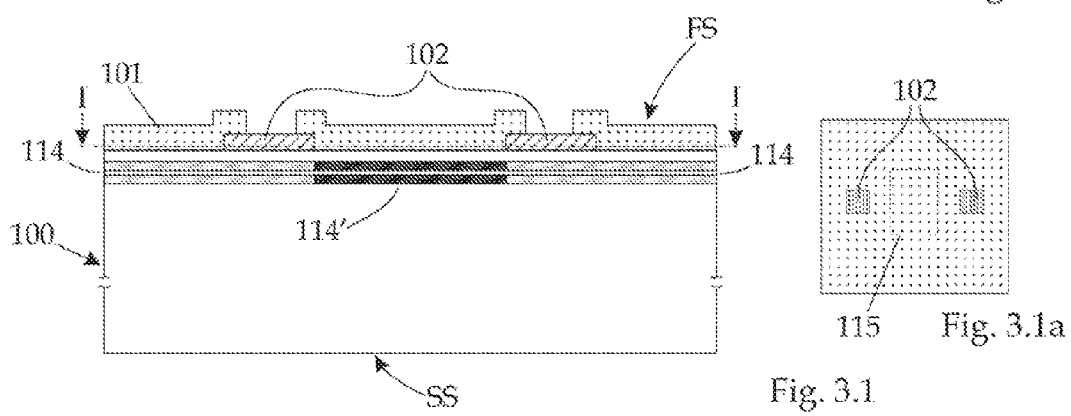
Fig. 3.1 Fig. 3.1a
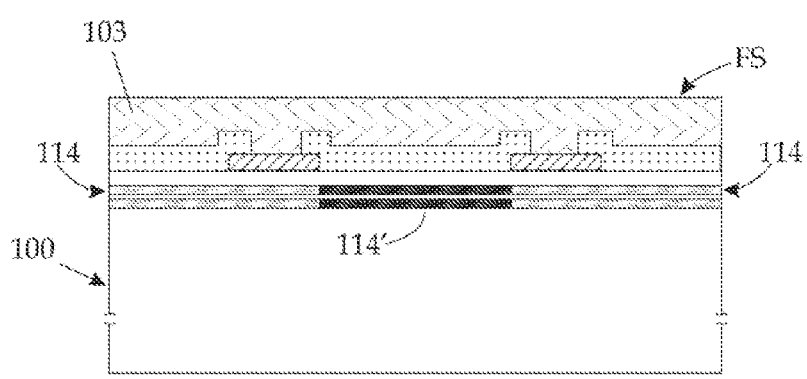
Fig. 3.2

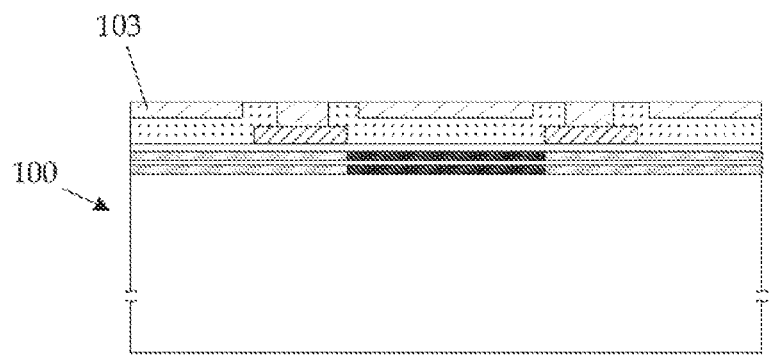
Fig. 3.3
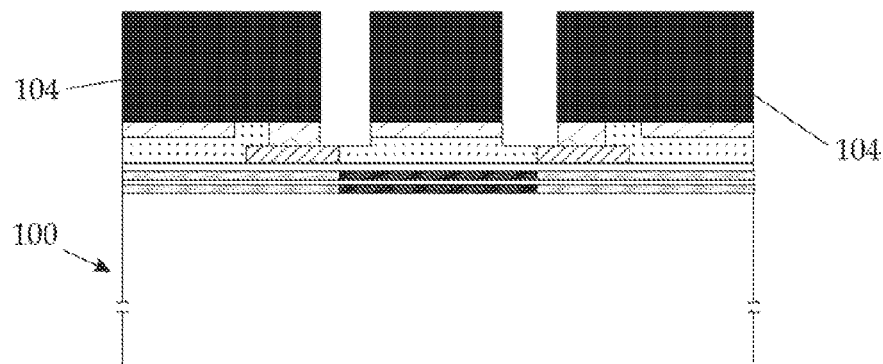
Fig. 3.4
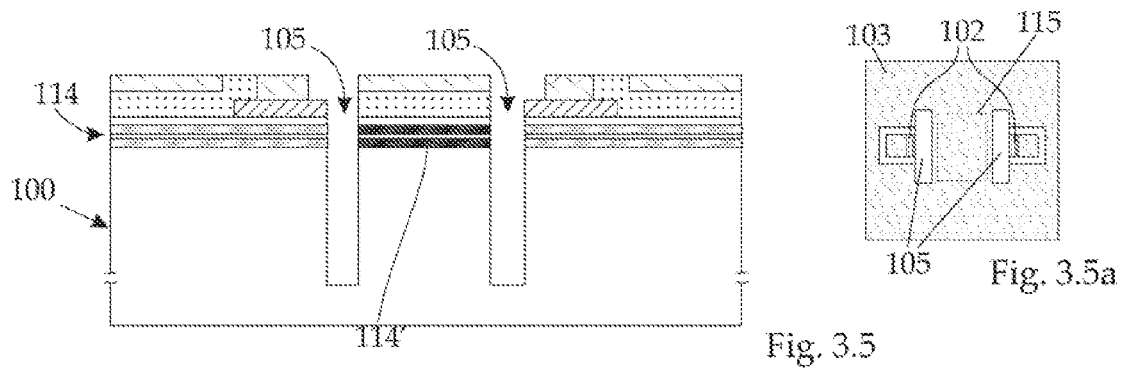
Fig. 3.5
Fig. 3.5a
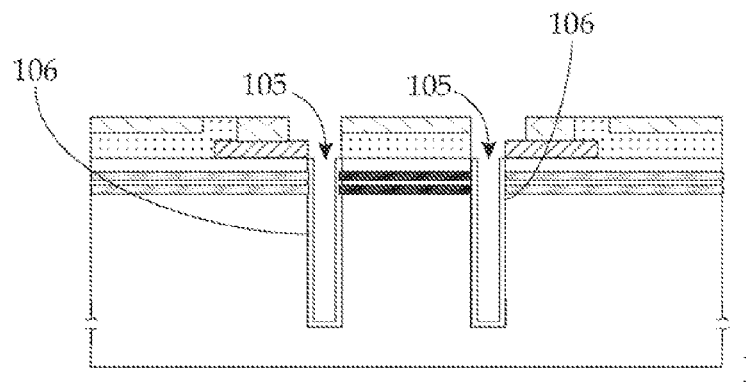
Fig. 3.6

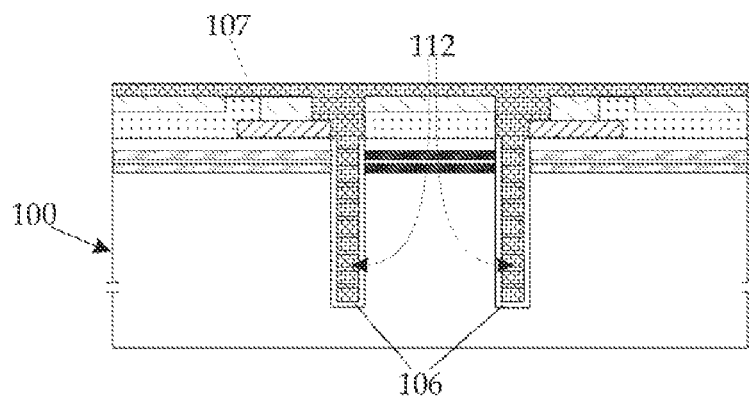
Fig. 3.7
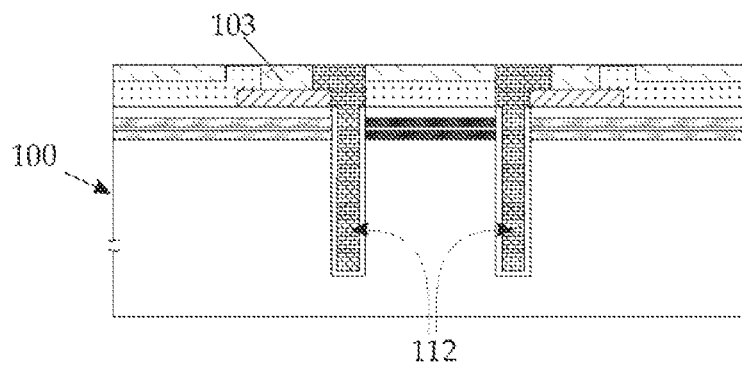
Fig. 3.8
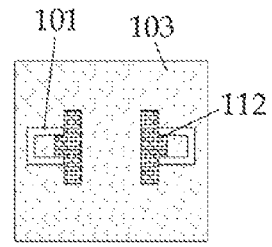
Fig. 3.8a
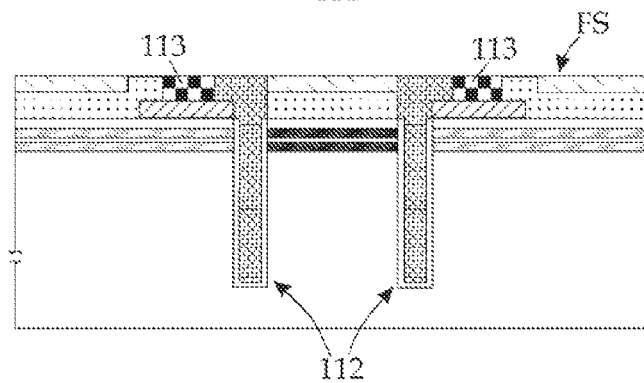
Fig. 3.9
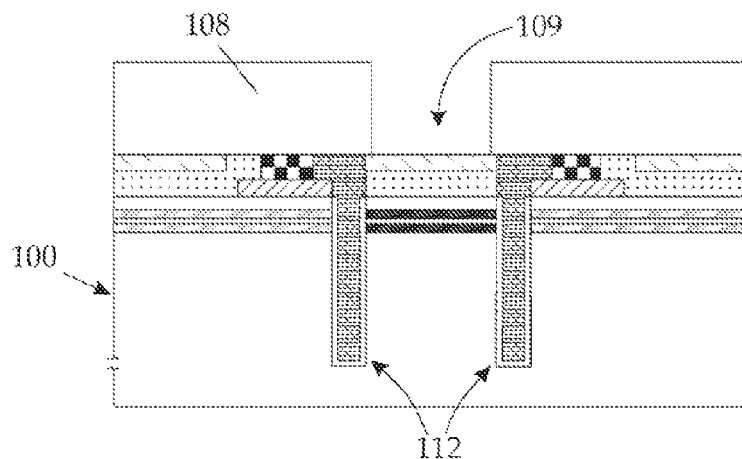
Fig. 3.10

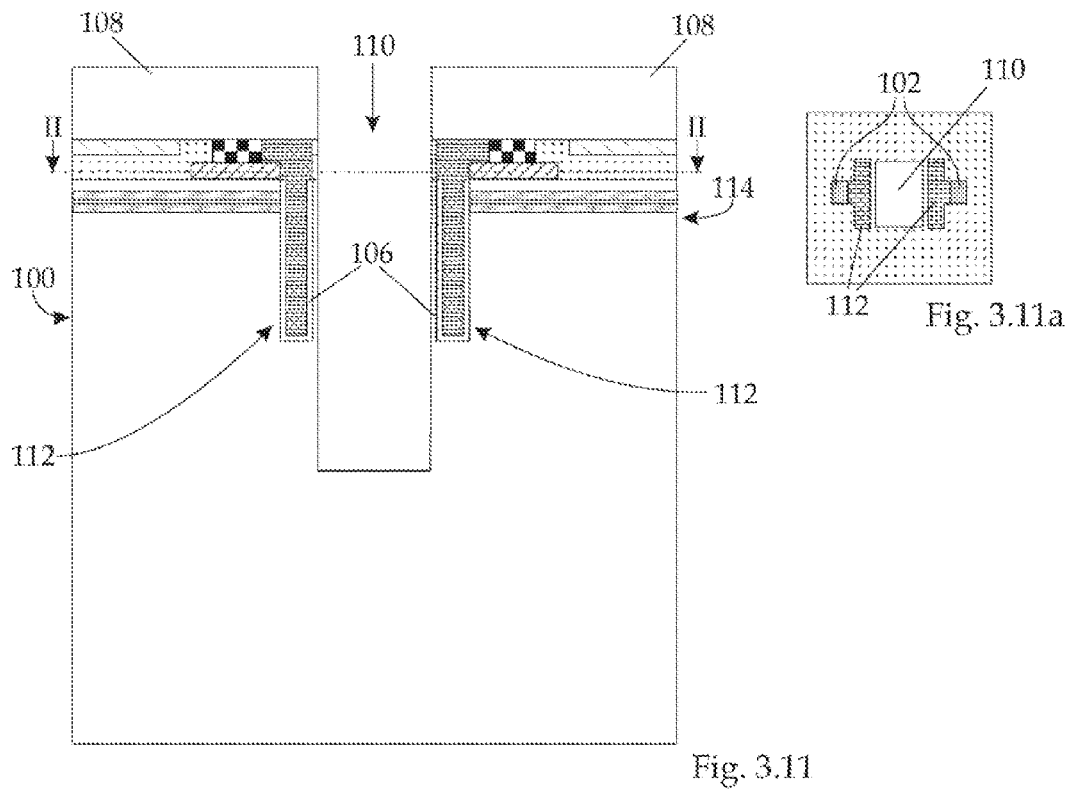
Fig. 3.11
Fig. 3.11a
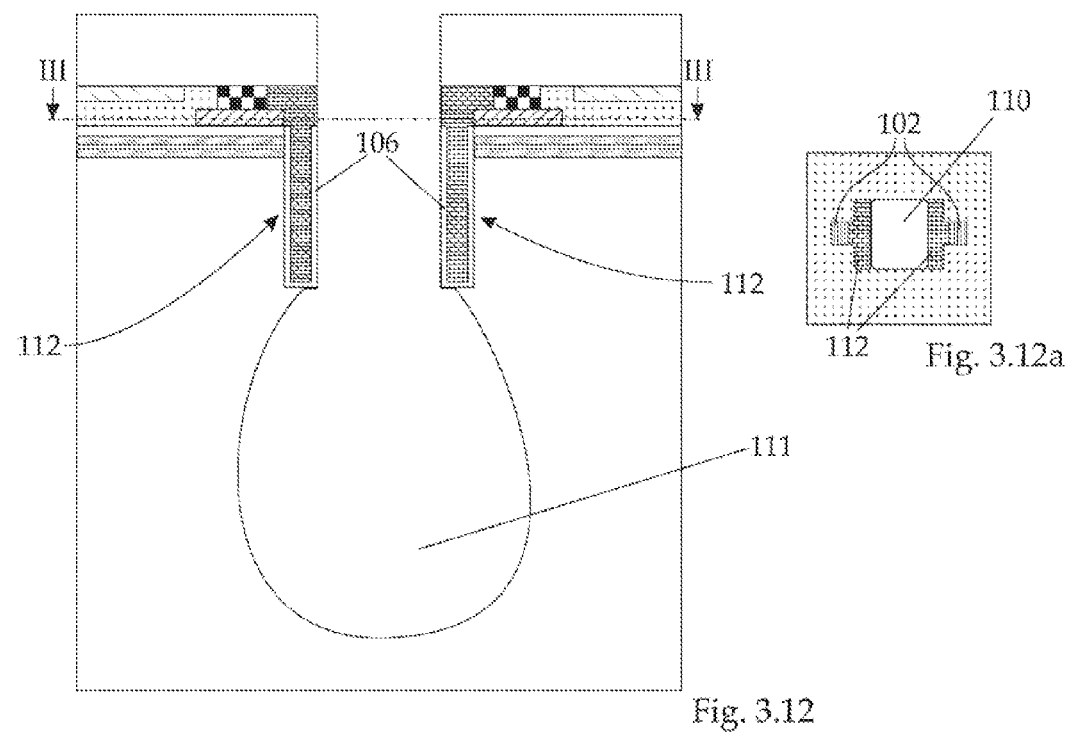
Fig. 3.12
Fig. 3.12a

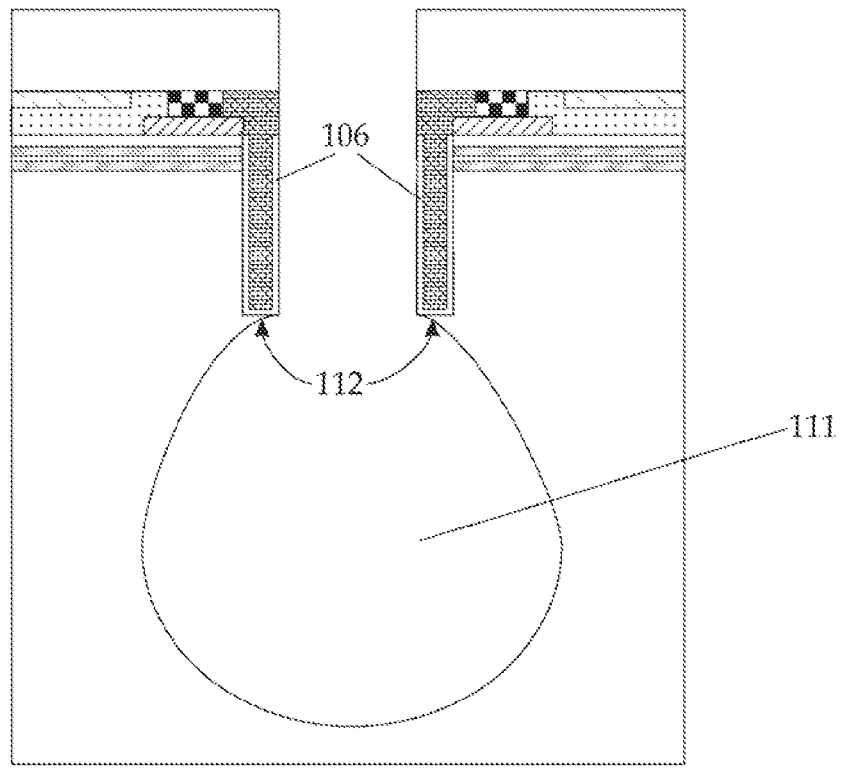
Fig. 3.13
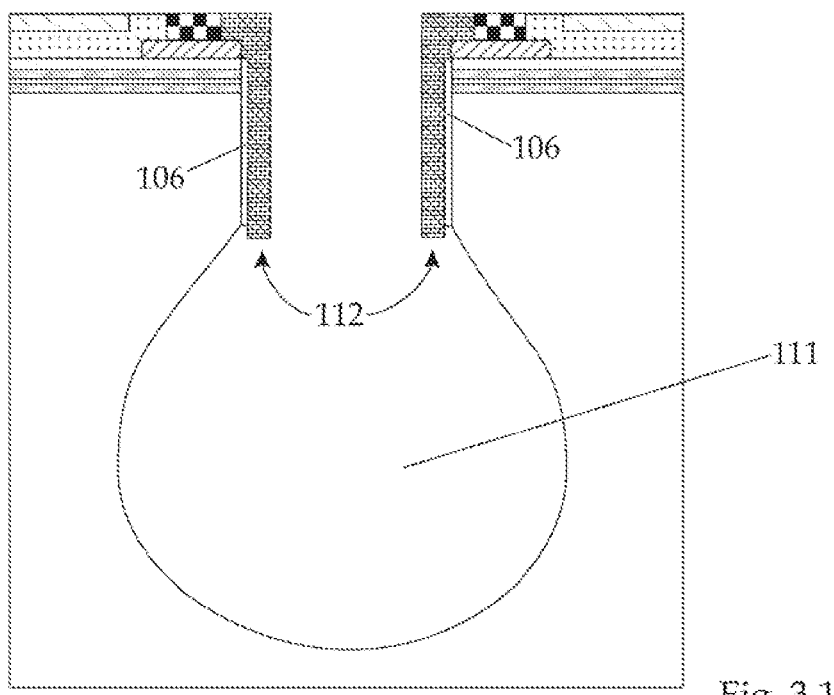
Fig. 3.14

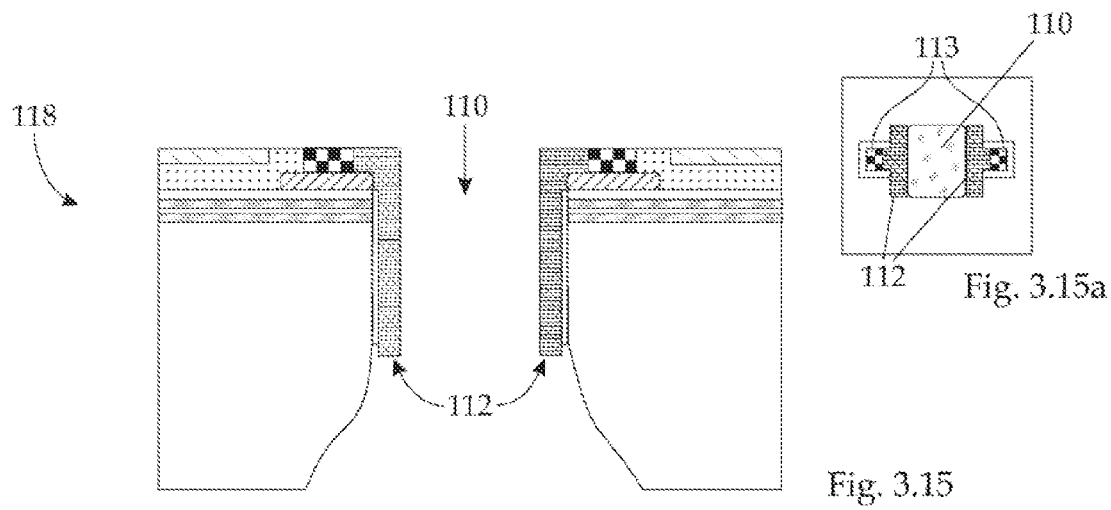
Fig. 3.15a
Fig. 3.15
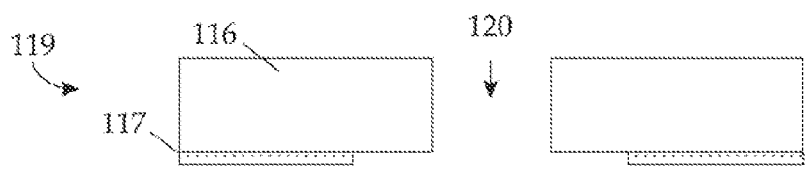
Fig. 3.16
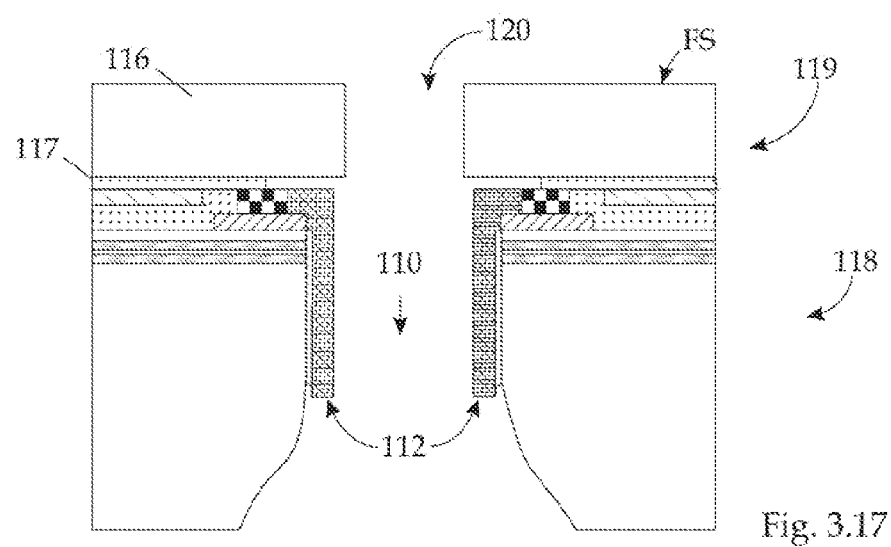
Fig. 3.17

METHOD FOR PRODUCING A MULTI-BEAM DEFLECTOR ARRAY DEVICE HAVING ELECTRODES

FIELD OF THE INVENTION AND DESCRIPTION OF PRIOR ART

The present invention relates to a method for producing a multi-beam deflector array device with a plurality of openings for use in a particle-beam exposure apparatus, in particular a projection lithography system, starting from a CMOS wafer. The term "CMOS wafer" here stands for a silicon wafer having, on a first side, a circuitry layer beneath a contact layer and a cover layer serving as passivation layer. The CMOS circuitry is arranged in a suitable way so that electrical stray fields, which may be caused by the supply voltages or active elements (e.g. flip-flops) during operation, are shielded with respect to areas outside the CMOS layer.

Furthermore, the invention relates to a multi-beam deflector array device for use in a particle-beam exposure apparatus produced with the abovementioned method.

In a particle-beam exposure apparatus, a particle beam is generated and formed by an illumination system and illuminates a pattern definition means having an array of apertures which define a beam pattern to be projected on a target surface. One important application of a particle-beam exposure apparatus of this kind is in the field of nano-scale patterning, by direct ion beam material modification or by electron or ion beam induced etching and/or deposition, used for the fabrication or functionalization of nano-scale devices. Another important application is in the field of maskless particle-beam lithography, used in semiconductor technology, as a lithography apparatus wherein, in order to define a desired pattern on a substrate surface, a substrate, e.g. a silicon wafer, is covered with a layer of a radiation-sensitive resist. A desired structure is exposed onto the photo-resist which is then developed, in the case of a positive resist by partial removal according to the pattern defined by the previous exposure step. The developed resist is used as a mask for further structuring processes such as reactive etching.

A particle-beam exposure apparatus is described in the U.S. Pat. No. 5,369,282. Arai et al. therein discuss an electron-beam exposure system using a so called blanking aperture array (BAA) which plays the role of the pattern definition means. The BAA carries a number of rows of apertures, and the images of the apertures are scanned over the surface of the substrate in a controlled continuous motion whose direction is perpendicular to the aperture rows. The rows are aligned with respect to each other in an interlacing manner so that the apertures form staggered lines as seen along the scanning direction. Thus, the staggered lines sweep continuous lines on the substrate surface without leaving gaps between them as they move relative to the substrate, thus covering the total area of the substrate to be exposed.

The U.S. Pat. No. 6,768,125 B2 by the applicant/assignee presents a multi-beam maskless lithography concept, dubbed PML2 (short for 'Projection Mask-Less Lithography #2'), that employs a pattern definition (PD) device comprising a number of plates stacked on top of the other, among them an aperture array means (aperture plate) and a deflector array means (blanking plate). These separate plates are mounted together at defined distances, for instance held in a casing. Highly accurate alignment between the two or more plates and excellent alignment towards the direction of the incoming beam is required.

The aperture plate comprises an array of apertures which define a beam pattern, consisting of beamlets, to be projected on a target surface. The aperture plate is used to form the shape of the beamlets. Another function of the aperture plate may be to absorb the majority of heat load imposed by the incoming beam. Corresponding blanking openings on the blanking plate are associated with said apertures. These blanking openings are located such that each of the beamlets traverses a blanking opening which corresponds to the respective aperture defining the beamlet. Each blanking opening is provided with a deflection means that can be controlled by a blanking signal between two deflection states, namely, a first state ('switched on') when the deflection means has assumed a state in which particles passing through the opening are allowed to travel along a nominal path to the target, and a second state ('switched off') when the deflection means is deflecting particles transmitted through the opening off said path so the particles do not reach the target.

Each of the deflection means comprises a set of beam blanking electrodes, basically a pair. The U.S. Pat. No. 7,276,714 of the applicant/assignee proposes to form the electrodes around the blanking openings by perpendicular growth employing state-of-the-art electroplating techniques. This document proposes to form one of the electrodes, the so called ground electrode, so as to have a substantial height over the blanking plate and the other electrode, the so called blanking electrode, with a smaller height. This is done in order to provide a better shielding of the blanking apertures against cross-talking and other unwanted effects.

There are several problematic issues in the use of pattern definition devices as described in prior art: The shielding of the blanking apertures against cross-talking, for instance, as well as a non-expensive way of producing said blanking means. In particular the forming of the electrodes employing perpendicular growth is a rather complex process. Additionally, such electrodes are very sensitive to deformation and stress.

Moreover, electrodes that have a substantial height over the blanking plate impose a limitation of the electric field strength tolerable in the vicinity of the blanking plate (this is due to stray fields around the electrodes caused by the boundary conditions for the field lines). This represents a disadvantage, especially when the blanking plate is used as a part of a grid lens (as for example described in U.S. Pat. No. 5,801,388 and U.S. Pat. No. 6,326,632 by the applicant/assignee) where the side of the blanking plate comprising the electrodes is used to define the electrostatic potential of the negative (diverging) and/or positive (collecting) electrostatic lens.

The US 2008 0203317 A1 of the applicant/assignee discloses a different solution to overcome the problems caused by electrodes protruding over the plates they are located on. Here, the electrodes are located in depressions that are formed in one of the surfaces of the blanking plate (top or back-side, with the topside being oriented towards the incoming beam). Thus, cross-talk is effectively reduced between the apertures with their respective electrodes since they are shielded by the substrate material of the multi-beam deflector array means.

SUMMARY OF THE INVENTION

The present invention sets out to present a method of producing said multi-beam deflector array means of high functionality at low cost.

According to the invention, this task is solved by a method as mentioned in the introductory part of this documentation, comprising the following steps:
 a) Generating at least one pair of parallel trenches on the first side of the wafer blank at the edges of an area where the circuitry layer below is non-functional, the trenches reaching through the passivation layer and the circuitry layer into the layer of bulk material, the trenches being located at a predetermined distance from each other according to the dimensions of said area, b) passivating the sidewalls and bottom surfaces of the trenches, c) depositing a conducting filling material into the trenches, thus creating columns of filling material designed to serve as electrodes, d) attaching metallic contact means to the electrodes where they reach out of the trenches on the first side of the CMOS wafer, e) structuring of an opening between the electrodes, said opening stretching across the area mentioned in step a) so that the electrodes are arranged opposite of each other on the sidewalls of the opening.

This method allows producing a multi-beam deflector array device with a plurality of openings, wherein each opening is associated with at least one pair of trench electrodes, embedded in the wafer material that forms the multi-beam deflector array means. The electrodes constitute metallic or electrically conductive (depending on the nature of the filling material) side-walls of the opening, isolated from the rest of the structure thanks to the passivation (or insulation) in step b). Passivation, amongst other things, insulates different materials electrically from each other and acts as a mechanical protection and diffusion barrier against water and sodium ions. Materials of choice are silicon nitride and silicon dioxide, for instance.

The trench electrodes may have one of various cross-sectional shapes, e.g. square, rectangular or polygonal. With the trench electrodes it is possible to influence beamlets of charged particles that pass through the opening formed between them. The openings are positioned on locations where the buried CMOS stack underneath the first side of the wafer blank is inactive or non-functional, respectively. This means that the CMOS structures under these locations are not needed for the functioning of the whole device. Thus, the openings can be structured through the CMOS stack without delimiting the function of the device.

In a variant of the invention, two pairs of parallel trenches are generated in step a) on the first side of the wafer blank, the direction of the trenches of the first pair being orthogonal to the direction of the trenches of the second pair, wherein the trenches of the second pair are connected to one trench of the first pair, forming U-shaped trench in the first side of the wafer blank.

The method consists of a combination of subsequent process steps including techniques that each are well established in the semiconductor industry and can be applied on various fields of technology. Furthermore, the method allows to produce deflector array means with fewer process steps and, thus, is cheaper than any of the state-of-the-art methods.

Advantageously, deep reactive ion etching (DRIE) may be used for structuring the trenches in step a) of the method according to the invention. DRIE is a well established method used in the production of microelectromechanical systems (MEMS; Micro Systems Technology—MST in Europe), applying either the cryogenic or the Bosch technology. Due to its high anisotropy DRIE allows for the creation of deep, steep-sided holes and trenches as required here.

In a variant of the invention, the conductive filling material is Tungsten (W) or Silicon-Germanium (SiGe). These materials are known to be well suitable for high aspect ratio trench fill processes and offer semiconductor processes for the fabrication of high resistivity insulating layers (necessary to avoid short cuts between the electrodes and the silicon bulk material underneath the CMOS oxide stack, referred also as non-functional layer).

To provide a good contacting of the columns of filling material or electrodes, respectively, the columns may be contacted with titanium nitride (TiN) or any other suitable conductive material. This ceramic material is deposited on the top of the columns that reach through to the first side of the wafer blank; with its conductivity of 30-70 μΩcm it allows for a good electrical connection.

Like in step a), the etching of the openings in step d) of the method according to the invention may preferably be done by using DRIE. Again, this allows for a highly anisotropic etching of the openings with nearly vertical sidewalls.

In a variant of the invention, step e) includes the sub-step of abrasion of a second side opposite to the first side of the wafer blank, thus reducing the thickness of the wafer blank until the opening reaches through the whole wafer blank. In other words, the thickness of the wafer blank is reduced until the bottom of the opening is removed and the opening reaches through the whole thickness of the wafer blank. Before the abrasion the bottom part of the openings may be enlarged, preferably using isotropic etching, thus creating a spherical cavity in the bulk material, which is then opened by diminishing the second side of the wafer blank.

Advantageously, an additional step f) after step e) includes the provision of a cover plate on the first side of the multi-beam deflector array device, said cover plate comprising a silicon membrane and having a plurality of apertures, each aperture being associated with a subsequent opening in the multi-beam deflector array device. The cover plate is electrically separated from the surface of the multi-beam deflector array device by an insulating layer. The cover plate may be produced by the consecutive formation of the insulating layer and the silicon membrane on the first side of the multi-beam deflector array device, using common processes of the semiconductor technology.

In another variant, the cover plate is produced separately from the multi-beam deflector array device and fixed to the multi-beam deflector array device by bonding or clamping. The cover plate can be produced by growing a layer of insulating material on a silicon wafer, or by diminishing a silicon-on-isolator (SOI) wafer until the silicon and the insulating layer have the required thicknesses.

In either variant, the insulating layer of the cover plate has to be retreated from the respective aperture and opening in order to avoid getting charged by the particle beam transgressing through the respective aperture and opening. A suitable distance of the insulating layer from the opening/aperture is four times the thickness of the insulating layer.

The cover plate can be fixed to the multi-beam aperture array device either mechanically, e.g. by clamping, or by bonding. The cover plate and the multi-beam aperture array device may be in direct contact; however, they might as well be arranged offset from each other, although the gap between them should be kept as small as possible.

The diameter of the aperture in the cover plate is preferably the same or smaller than the diameter of the subsequent opening.

The cover plate serves to avoid cross talk between neighboring openings/apertures of the multi-beam deflector array device. The cover plate forms an equipotential surface directed towards the incoming beam and shields neighboring apertures/openings from mutual stray fields. Thus, the beamlets of neighbored apertures/openings are not affecting each other.

The invention further relates to abovementioned multi-beam deflector array device for use in a particle-beam exposure apparatus employing a beam of charged particles, said device being produced by the method as described above.

BRIEF DESCRIPTION OF THE DRAWINGS

In the following, the present invention is described in more detail with reference to the drawings, which show.

DETAILED DESCRIPTION OF THE INVENTION

The preferred embodiments of the invention discussed in the following are related to a PML2-type particle-beam exposure apparatus with a pattern definition system as disclosed in the U.S. Pat. No. 6,768,125 and U.S. Pat. No. 7,276,714 of the applicant/assignee, and with a large-reduction projection system. In the following, first the technical background of the apparatus is discussed—as far as relevant to the invention—, then the invention is presented in detail.

It should be appreciated that the invention is not restricted to the following embodiments or the particular layout of the PD system, which merely represent one of the possible applications of the invention; the invention is suitable for other types of processing systems that employ a particle-beam with projector stages as well.

Maskless Particle-Beam Processing Apparatus

Figure 1:
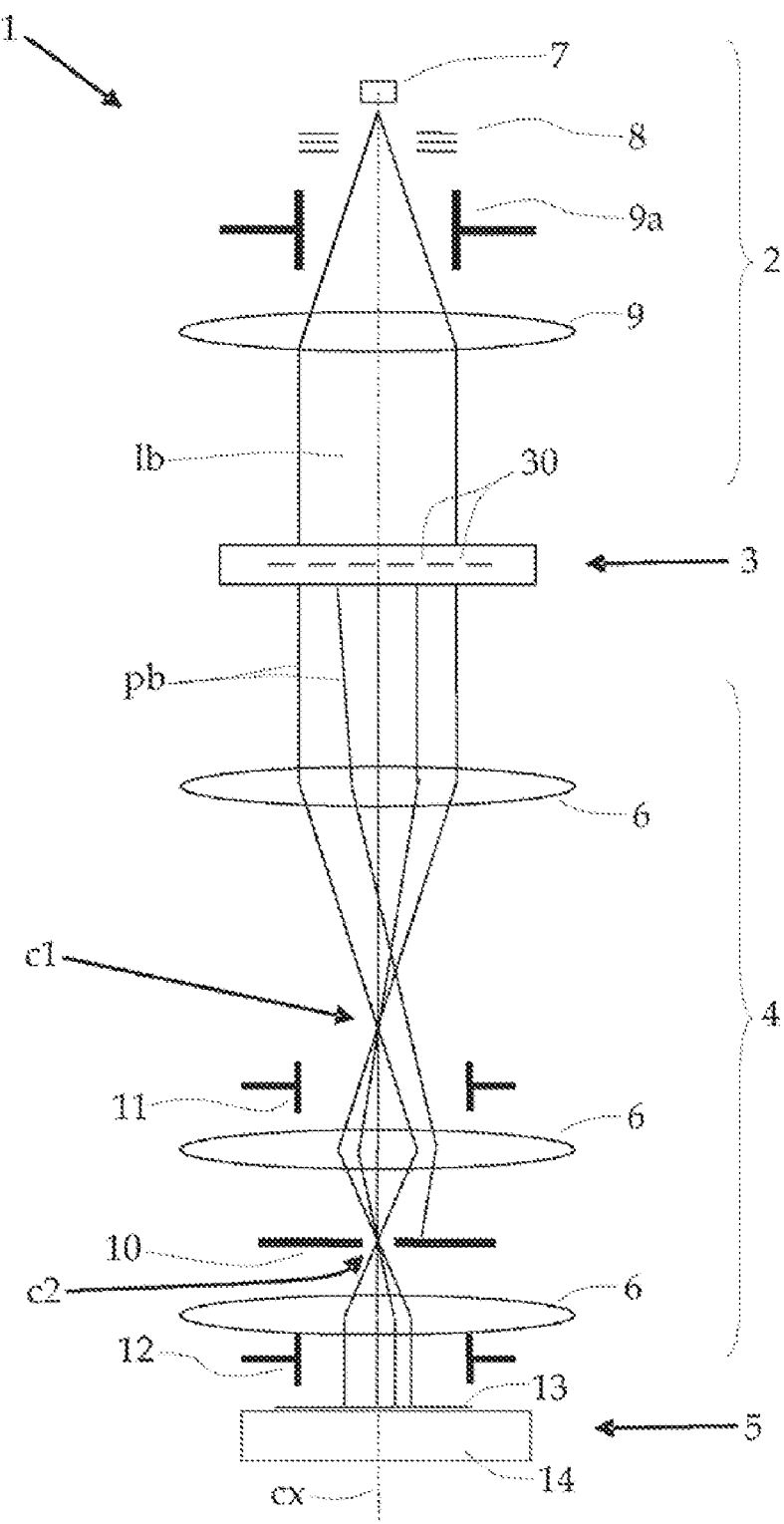
FIG. 1 a schematic overview of a particle-beam exposure apparatus according to prior art, but suitable for the invention, in a longitudinal section, FIG. 2 a sectional detail of a multi-beam deflector array device produced with the method according to the invention with an upstream aperture plate, FIGS. 3.1-3.17 a diagrammatic sequence illustrating the method according to the invention in a number of sequence steps in sectional views, FIGS. 3.1a, 3.5a, 3.8a, 3.11a, 3.12a, 3.15a plan views of the respective sequence steps, FIGS. 3.1a, 3.11a and 3.12a along the lines I-I, II-II and III-III, respectively, FIG. 4 a variant of a multi-beam deflector array means produced with the method according to the invention, FIG. 5a-5d possible arrangements of the trenches/electrodes neighboring the opening, and FIG. 6 another arrangement of the trenches/electrodes surrounding the opening.

FIG. 1 shows a schematic overview of a maskless particle-beam processing apparatus PML2 which itself is known from prior art but is suitable to embody the device manufactured by the method of the present invention. The components are not shown to size; in particular, the lateral width of the particle beam lb, pb is exaggerated. In the following, only those details are given as needed to disclose the invention. For more details, the reader is referred to U.S. Pat. No. 6,768,125 and U.S. Pat. No. 7,276,714.

The main components of the lithography apparatus 1—corresponding to the direction of the lithography beam lb, pb which in this example runs vertically downward in FIG. 1—are an illumination system 2, a pattern-definition (PD) system 3, a projecting system 4 and a target station 5 with a substrate 13 which is held and positioned by a wafer stage 14. The whole apparatus is contained in a vacuum housing (not shown) held at a high vacuum to ensure an unimpeded propagation of the beam lb, pb along the optical axis cx of the apparatus. The optical systems 2, 4 are realized using electrostatic or electromagnetic lenses which are depicted symbolically by reference numbers 6.

The illumination system 2 comprises, for instance, an electron gun 7, an extraction system 8 as well as a condenser lens system 9. A general blanking deflector 9a may be present as well. It should, however, be noted that in place of electrons, in general, other electrically charged particles can be used. Apart from electrons these can be, for instance, hydrogen ions or heavier ions, charged atom clusters, or charged molecules. In the context of this disclosure "heavier ions" refer to ions of elements heavier than C, such as O, N, or the noble gases Ne, Ar, Kr, Xe.

By means of the condenser lens system 9, the particles emitted from the illumination system 2 are formed into a wide, substantially telecentric particle beam serving as lithography beam lb. The lithography beam lb then irradiates the PD system 3 which is held at a specific position in the path of the lithography beam lb. The PD system 3 comprises a number of plates with a plurality of openings and/or apertures 30, arranged in regular arrays, which define a beam pattern to be projected on the substrate 13.

Some of the apertures and/or openings are "switched on" or "open" so as to be transparent to the incident beam in the sense that they allow the portion of the beam (beamlet) that is transmitted through it to reach the target. The other apertures and/or openings are "switched off" or "closed", in the meaning that the corresponding beamlets cannot reach the target (even though they may leave the PD system and travel through some portion of the projecting system 4); effectively, these "switched off" apertures and/or openings are non-transparent (opaque) to the beam. As a consequence, the lithography beam lb is structured into a patterned beam pb, emerging from the PD system 3. The pattern of switched on apertures and/or openings—the only portions of the PD system 3 which are transparent to the lithography beam lb—is chosen according to the pattern to be exposed on the substrate 13. It should be noted that the "switching on/off" of the beamlets usually is realized by a blanking means of a suitable kind provided in one of the plates of the PD system 3: "Switched off" beamlets are deflected off their path (by very small angles) so they cannot reach the target but are merely absorbed somewhere in the lithography apparatus, e.g. by an absorbing plate 10. In FIG. 1 only five beamlets of the patterned beam pb are shown as representatives for an actual large number of beamlets. One of the beamlets is switched off and is absorbed at the absorbing plate 10 while the other four beamlets are directed to the target 13 where they form images of the respective apertures 30.

In the embodiment shown in FIG. 1, the projection system 4 is composed of a number of consecutive particle-optical projector stages, consisting of electrostatic and/or electromagnetic lenses and other deflection means. These lenses and means are shown in symbolic form only, since their realization is well known from prior art. The projection system 4 employs a demagnifying imaging through two crossovers c1, c2. The demagnification factor for both stages is chosen such that an overall demagnification of several hundred results, e.g. 200× (FIG. 1 is not to scale). A demagnification of this order is in particular suitable with a lithography setup, in order to alleviate problems of miniaturization in the PD device.

Throughout the projection system 4, provisions are made to extensively compensate the lenses and or deflection means with respect to chromatic and geometric aberrations. As a means to shift the image laterally as a whole, i.e. along a direction perpendicular to the optical axis cx, deflection means 11 and 12 are provided in the projection system 4. The deflection means can be realized as, for instance, a multipole electrode system which is either positioned near a crossover, as shown in FIG. 1 with the first deflection means 11, or after the final lens of the respective projector, as in the case with the second stage deflection means 12 in FIG. 1. In this apparatus, a multipole electrode is used as deflection means both for shifting the image in relation to the stage motion and for correction of the imaging system in conjunction with the alignment system. These deflection means 11, 12 are not to be confused with the blanking array means of the PD system 3 which are used to switch selected beamlets of the patterned beam pb "on" or "off", since the former only deal with the particle beam as a whole.

FIG. 2 shows a detail of the PD system 3 of FIG. 1 in a sectional view along a plane parallel to the optical axis cx. Here, the PD system 3 comprises two plates, an aperture plate 3a and a multi-beam deflector array means 3b. The aperture plate 3a has a number of apertures 30 which serve to partition the incoming lithography beam lb into a plurality of beamlets; the number of beamlets depends on the number of apertures 30 in the aperture plate 3a.

The multi-beam deflector array means 3b has a plate-like shape with a plurality of openings 30', each opening 30' being associated with an aperture 30 in the aperture plate 3a. Thus, a beamlet of any given aperture 30 pervades the corresponding opening 30' in the multi-beam deflector array means 3b. Each opening 30' in the multi-beam deflector array means 3b has at least two blanking electrodes (not shown in FIG. 2) to influence the beamlets. Depending on the state of the electrodes ("switched off"/open or "switched on"/closed), the beamlets either travel through the opening 30' unaffected (electrodes "switched off") or are deflected off their path (electrodes "switched on"). In the latter case, the beamlets do not reach the target (target 13 in FIG. 1) and are absorbed by an absorbing plate (10 in FIG. 1). For the sake of simplicity, FIG. 2 shows only four beamlets A, B, C, D: Two of them are unaffected (A, B) and continue their travel through the lithography apparatus 1, whereas two beamlets (C, D) are deflected off their path by activated electrodes. The angle of deflection is highly exaggerated in FIG. 2 to illustrate the principle of operation.

In the following, the method of fabricating abovementioned multi-beam deflector array means is discussed in detail in FIGS. 3.1-3.17, showing the fabrication steps of the method. FIGS. 3.1a, 3.5a, 3.8a, 3.11a, 3.12a and 3.15a show plan views of the corresponding sequence steps for better understanding, where FIGS. 3.1a, 3.11a and 3.12a represent sectional views along the lines I-I, II-II and III-III, respectively.

FIGS. 3.1-3.17 show cross-sections of a wafer being processed according to the subsequent steps 1 to 16 of one variant of the process according to the invention. For the sake of clarity the fabrication is explained by focusing on one opening and its associated electrodes (this applies to cross-sectional views as well as plan views); of course a multi-beam deflector array means consists of a plurality of openings and electrodes. Furthermore the structures are not to size; the following explanation represents no restriction of any kind to the present invention.

A start wafer 100 with a thickness of around 300 μm is the base material for the fabrication method shown in FIGS. 3.1-3.17. The start wafer 100 is preferably a CMOS wafer, the term "CMOS wafer" here signifying a silicon wafer as bulk material, having a layer of circuitry 114, 114' applied on a first side of the silicon wafer, the circuitry layer 114, 114' being covered by a contact layer and a passivation layer 101.

The start wafer 100 in FIG. 3.1, shown in a cross-section, has a contact layer with two pads 102 of metallic material which are partly covered by a passivation layer 101 of silicon nitride ($Si_3N_4$) which extends over the surface of the start wafer 100. Other passivating materials, like silicon dioxide, might be used as well. Henceforth, the side with the layer of $Si_3N_4$, shown here on the upper surface, will be called first side FS of the wafer 100 whereas the opposite side (lower surface) will be referred to as second side SS.

Additionally, the start wafer 100 contains a buried circuitry layer 114. The term "circuitry layer" here signifies a number of intrinsic layers, e.g. four to 16 or more, forming a stack; not all of these layers are shown in the figures for better clarity. The circuitry layer 114 extends over most of the wafer blank 100, however, in some parts the circuitry layer 114 is perforated, inactive or non-functional, respectively. This means that damages done to these regions of inactive circuitry 114' of the circuitry layer 114, e.g. by perforating it as described below, do not affect the functionality of the whole layer. The CMOS circuitry is arranged in a suitable way ensuring that electrical stray fields, which may be caused by the supply voltages or active elements (e.g. flip flops) during operation, are shielded with respect to areas outside the circuitry layer 114. One suitable way could be to design the CMOS structure in such a way that the topmost and lowest metallic layer are set to ground potential (=0V with respect to the surface potential), and vertical via structures are formed around the areas where the beams pass the circuitry layer 114 (i.e. around the non-functional areas of the CMOS where the openings are to be formed).

In FIG. 3.1, such a buried stack of inactive circuitry 114' is located between the two metallic pads 102. These metallic pads 102 are prospective metal contacts. The metallic pads 102 are connected to the circuitry layer 114 with via contacts. These contacts are not depicted in the figures for the sake of clarity. In the variant of the method shown here, the metallic pads 102 are arranged in a mutual distance of 13 μm.

FIG. 3.1a shows a sectional view of the first side FS of the start wafer 100 along the line I-I, with the two metallic pads arranged opposite of each other. The area 115 between the pads, marked with a dotted line, is the area where the inactive circuitry 114' is located.

In a first step of the fabrication process (FIG. 3.2), a layer of silicon oxide ($SiO_2$) 103 is produced on the first side FS of the wafer blank 100. In a subsequent step, depicted in FIG. 3.3, the thickness of the layer of silicon oxide is reduced by an appropriate process, e.g. chemical mechanical polishing (CMP).

In order to prepare the ground for the subsequent steps which include etching, an etch stop layer 104 is produced on the first side FS of the wafer blank 100 in a step that is depicted in FIG. 3.4. Afterwards, the layer of silicon oxide 103 and the layer of silicon nitride 101 are etched by applying dry etch to prepare the structuring of the trenches.

In a next step, shown in FIG. 3.5, a pair of trenches 105 is etched into the start wafer 100 with deep reactive ion etching (DRIE), the trenches 105 reaching through the inactive circuitry layer 114' into the bulk material 100. For instance, the depth of the trenches 105 may be 30 μm; other values are possible as well. Due to the use of DRIE it is possible to produce extremely narrow trenches, with a diameter of approximately 1 to 2 μm. The cross-section of the trenches is rectangular or circular, but it is also possible to structure other shapes as well. FIG. 3.5a shows the arrangement of the trenches 105 in a top view of the structure. The area 115 where the inactive circuitry layer 114' is located is once again marked with a dotted line.

The trenches in FIG. 3.5a are formed as two parallel trenches. It is, however, also possible to form two pairs of trenches, the direction of the trenches of a first pair being orthogonal to the direction of a second pair. The trenches of the second pair may be connected to one trench of the first pair, thus forming a U-shaped trench (see FIG. 6).

In a further step, depicted in FIG. 3.6, the side-walls and bottom of the trenches are passivated by deposition of a layer of oxide 106, for instance $SiO_2$. Subsequently, an adhesion layer may be deposited to facilitate further production steps. This step is very important to insulate the electrodes that will be formed in the subsequent steps from the surrounding material.

FIG. 3.7 depicts the deposition of a conductive filling material 107 into the trenches 105. Various materials can be used for this task, e.g. metals like Tungsten (W) or semiconductor materials like silicon-germanium (SiGe), to name only two. The material fills the entire trench from the bottom up to the surface of the wafer blank 100. Thus, a column of filling material 107 is formed in each trench, forming a prospective electrode 112. It is very important that the filling material 107 is electrically insulated from the surrounding structure; in the shown embodiment this is ensured by the passivation, produced previously.

Superfluous filling material is removed by chemical mechanical polishing or comparable abrasive methods in a further step that is shown in FIG. 3.8. FIG. 3.8a shows a top view of the start wafer 100 with the electrodes 112 formed in the trenches.

In a further step (FIG. 3.9) the oxide layer 103 around the trenches 105/electrodes 112 is patterned and partly removed to allow contacting the top of the electrodes 112 on the first side FS. This contacting is done by depositing a metallic material 113, e.g. titanium nitride (TiN).

Figures 5A, 5B, 5C, 5D:
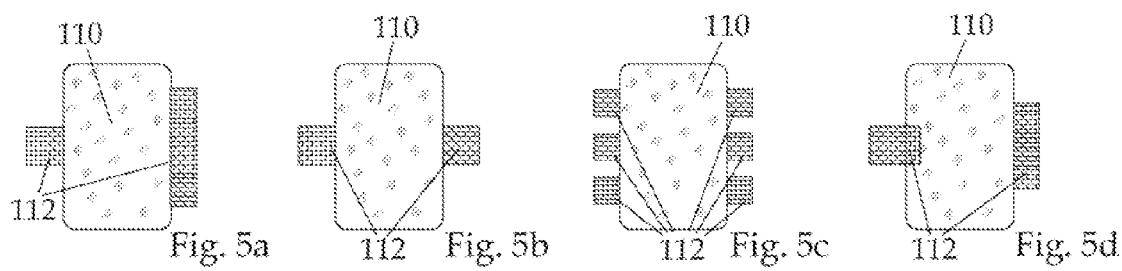
Figure 6:
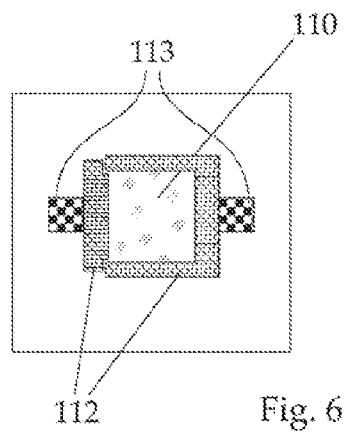

Design and arrangement of the trenches 105/electrodes 112 as depicted in FIGS. 3.1-3.15 and FIGS. 3.5a, 3.8a, 3.11a, 3.12a and 3.15a is only one of many possible arrangements. FIGS. 5a to 5d show five exemplary variants for arranging the trenches 105/electrodes 112. In FIG. 5c, which shows three electrodes 112 on each side of the opening 110, the electrodes on each side have to be connected with each other for obvious reasons. FIG. 6 shows abovementioned embodiment where one electrode 112 is U-shaped. To this end two pairs of trenches are formed, the direction of the trenches of a first pair being orthogonal to the direction of a second pair. The trenches of the second pair are connected to one trench of the first pair, thus forming a U-shaped trench.

The next steps illustrate the structuring of the opening between the electrodes 112. To this end the first side FS of the wafer 100 is covered with a layer of resist 108 (FIG. 3.10) to prepare the wafer blank 100 for subsequent lithographic processes. In the course of the processes, a recess 109 is structured in the layer of resist 108, the recess 109 being located between the electrodes 112.

FIG. 3.11 shows the etching of the opening 110 by means of DRIE. The depth of the opening 110 is approximately 150 µm in the variant of the invention discussed here. The diameter of the opening 110 is chosen in such a way so that the side walls of the opening 110 coincide with the layers of oxide 106 around the electrodes 112. Furthermore, the dimensions of the opening 110 are within the area 115 of the wafer blank 100 where the buried circuitry layer 114 is inactive (non-functional). Thus, by etching the opening 110 through the inactive circuitry layer 114', the functionality of the CMOS is not affected.

FIG. 3.11a shows the opening 110 and its position relative to the electrodes 112 in a plan view of the wafer along the line II-II.

By means of isotropic etching a cavity 111 is created at the bottom of the opening 110 (FIG. 3.12). The isotropic etching also widens the opening 110 so that it extends until the layers of oxide 106 around the electrodes 112. FIG. 3.12a shows a sectional top view of the wafer in that stage along the line III-III.

In a further step the diameters of the cavity 111 and the opening 110 are enlarged by further application of isotropic etching (FIG. 3.13). The electrodes 112, still covered by a layer of Silicon oxide 106, now extend almost completely into the opening 110.

By application of vapor high frequency etching the layer of oxide 106 around the electrodes 112 is removed to form blank side walls of the opening 110. FIG. 3.14 shows that the bare conductive filling material 107 making up the electrodes 112 now extends into the opening 110. The electrodes 112 form metallic (or, more generally, conductive, depending on the material used to fill the trenches to form the electrodes 112) side-walls of the opening 110. The other side-walls of the opening 110 (not depicted in the sectional view of FIGS. 3.1-3.15), if not sufficiently conductive, may be covered with a metallic layer (which may be isolated from the electrodes 112) that is connected to the ground potential of the CMOS geometry. In an embodiment as depicted in FIG. 6, all side walls of the opening 110 are occupied by electrodes 112 generating metallic side walls. In principle, the steps depicted in FIGS. 3.12 and 3.13 are optional: It is not necessary to etch the cavity 111, instead the second side SS of the wafer blank 100 may be diminished right away and the opening etched straight, i.e. without cavity. However, the layer of oxide 106 around the electrodes 112 (as in FIG. 3.14) needs to be removed to allow for proper functioning of the device.

In a subsequent step (FIG. 3.15), the second side SS of the wafer blank 100 is thinned by grinding or etching or other techniques. FIG. 3.15 shows a partial sectional view of a multi-beam deflector array device 118 produced by the method according to the invention. The thickness of the wafer blank 100 is reduced to between 30 and 100 µm. FIG. 3.15a shows a plan view of the wafer blank 100 with the opening 110 reaching through the entire wafer.

A further step, depicted in FIGS. 3.16 and 3.17, may be added in order to obtain an arrangement avoiding electrostatic stray fields originating from the vertical electrodes 112, which could lead to cross-talk effects on the first side FS of the wafer 100. (Remark: Vertical via structures around the active CMOS structure and grounded metallic layers do no generate stray fields by the CMOS activity in the same region). One of many possibilities is to bond or glue or mechanically fix a cover plate 119 (comprising a membrane 116 with apertures and an insulating layer 117) on the first side FS of the multi-beam deflector array device 118 as depicted in FIG. 3.15, resulting in a cross-talk shielded structure. To this end, an insulating layer 117 is formed on a silicon membrane 116 with a thickness of 10-30 µm, for instance. The thin insulating layer 117 may be silicon dioxide or any other suitable insulating material with a thickness of 0.1 to 1 µm, for instance. It is also possible to use a silicon-on-isolator (SOI) wafer and diminish it until the insulating layer and the silicon have the desired thicknesses. In yet another variant, the cover plate could be grown on the first side of the multi-beam deflector array device 118, by first depositing an insulating layer followed by a silicon layer.

The cover plate 119 has a plurality of apertures 120, each aperture 120 coinciding with an opening 110 of the subsequent multi-beam aperture array device 118. The diameter of the apertures 120 of the cover plate 120 is smaller than or, at most, equal to the diameter of the openings 110 of the multi-beam aperture array device 118. Preferably, the diameter of the apertures 120 in the insulating layer 117 of the cover plate 119 is larger than in the membrane 116. Thus, charging of the insulating layer 117 by the beamlets that travel through the aperture 120 and opening 110 can be prevented.

The cover plate 119 is joined to the multi-beam deflector array device 118 as depicted in FIG. 3.17. The joining can be done mechanically, e.g. by clamping, by bonding or any other suitable way. Another way would be to deposit an insulating layer and then a conductive layer to achieve a similar configuration where the insulating layer is pulled back (i.e. retreated in lateral direction) with respect to the diameter of the opening 110 to avoid charging phenomena caused by scattered particles such as for example secondary electrons. Furthermore, the cover plate 119 could also be arranged offset from the multi-beam deflector array device 118.

By virtue of the adjustments depicted in FIG. 3.17, the multi-beam deflector array device 118 is produced with an integrated cover plate 119 to shield stray fields and avoid cross-talk of neighboring beams.

Figure 4:
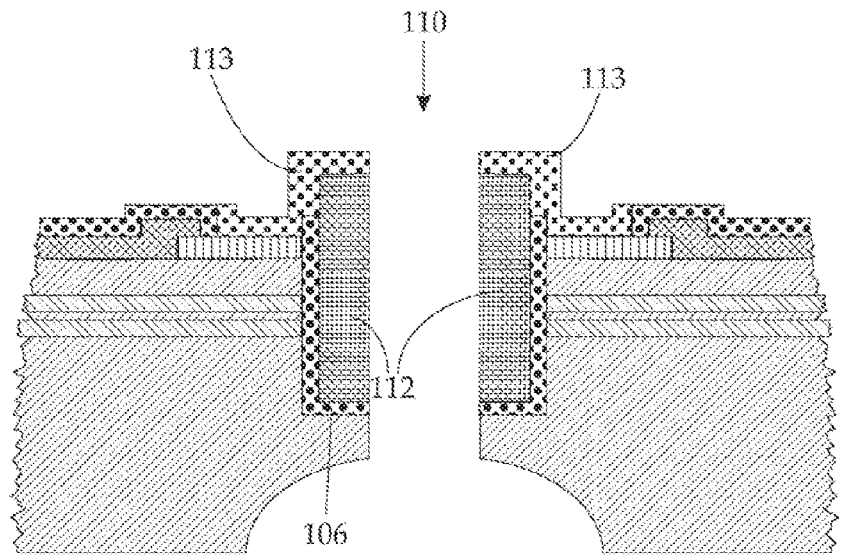

FIG. 4 shows a multi-beam deflector array means produced with a slightly different layout. Here, the electrodes 112 surmount the surface of the topside TS of the wafer blank 100 and a metallic layer 113 to contact the electrodes 112 is deposited differently. Furthermore, the electrodes 112 are not completely freestanding but embedded into the bulk material of the wafer blank 100.

We claim:

1. A method for producing a multi-beam deflector array device with a plurality of openings for use in a particle-beam exposure apparatus, in particular a projection lithography system, starting from a CMOS wafer, comprising a silicon wafer having, on a first side, a circuitry layer beneath a contact layer and a cover layer, the cover layer serving as a passivation layer, said method comprising the following steps, performed at at least one location on the wafer:
   a) Generating at least one pair of parallel trenches on the first side of the wafer blank at the edges of an area where the circuitry layer below is non-functional, the trenches reaching through the passivation layer and the circuitry layer into the layer of bulk material, the trenches being located at a predetermined distance from each other according to the dimensions of said area,
   b) passivating the sidewalls and bottom surfaces of the trenches,
   c) depositing a conducting filling material into the trenches, thus creating columns of filling material designed to serve as electrodes,
   d) attaching metallic contact means to the electrodes where they reach out of the trenches on the first side of the CMOS wafer,
   e) structuring of an opening located between the electrodes, said opening extending over the area mentioned in step a) so that the electrodes are arranged opposite of each other on the sidewalls of the opening.

2. The method of claim 1, wherein in step a) two pairs of parallel trenches are generated on the first side of the wafer blank, the direction of the trenches of the first pair being orthogonal to the direction of the trenches of the second pair, wherein the trenches of the second pair are connected to one trench of the first pair, forming a U-shaped trench in the first side of the wafer blank.

3. The method of claim 1, wherein in step a) the trenches are structured by using the method of DRIE.

4. The method of claim 1, wherein the filling material in step b) is Tungsten (W) or Silicon-Germanium (SiGe).

5. The method of claim 1, wherein in step c) the columns are contacted with Titanium Nitride (TiN).

6. The method of claim 1, wherein in step d) the etching of the apertures is done by using the method of DRIE.

7. The method of claim 1, wherein step e) includes the substep of abrasion of a second side opposite to the first side of the wafer blank, thus reducing the thickness of the wafer blank until the opening so that the opening reaches through the whole wafer blank.

8. The method of claim 7, wherein before the abrasion the bottom part of the openings is enlarged preferably using isotropic etching, thus creating a spherical cavity in the bulk material, which is then opened.

9. The method of claim 1, wherein in a step f) a cover plate is provided on the first side of the multi-beam deflector array device, the cover plate comprising a silicon membrane and having a plurality of apertures, each aperture being associated with a subsequent opening in the multi-beam deflector array device.

10. The method of claim 9, wherein the cover plate of step f) is produced separately from the multi-beam deflector array device and fixed to the multi-beam deflector array device by bonding or clamping.

11. A multi-beam deflector array device produced with the method of claim 1.

12. A multi-beam deflector array device produced with the method of claim 2.

13. A multi-beam deflector array device produced with the method of claim 3.

14. A multi-beam deflector array device produced with the method of claim 4.

15. A multi-beam deflector array device produced with the method of claim 5.

16. A multi-beam deflector array device produced with the method of claim 6.

17. A multi-beam deflector array device produced with the method of claim 7.

18. A multi-beam deflector array device produced with the method of claim 8.

19. A multi-beam deflector array device produced with the method of claim 9.

20. A multi-beam deflector array device produced with the method of claim 10.

* * * * *